(12) United States Patent
Abe et al.

(10) Patent No.: US 9,281,071 B2
(45) Date of Patent: Mar. 8, 2016

(54) SEMICONDUCTOR MEMORY DEVICE

(71) Applicant: Kabushiki Kaisha Toshiba, Tokyo (JP)

(72) Inventors: Katsumi Abe, Kanagawa-ken (JP); Masahiro Yoshihara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 13/832,983

(22) Filed: Mar. 15, 2013

(65) Prior Publication Data

US 2014/0003154 A1    Jan. 2, 2014

(30) Foreign Application Priority Data

Jul. 2, 2012    (JP) ................. 2012-148618

(51) Int. Cl.
| | |
|---|---|
| G11C 11/34 | (2006.01) |
| G11C 16/28 | (2006.01) |
| G11C 16/34 | (2006.01) |
| G11C 11/56 | (2006.01) |
| G11C 16/24 | (2006.01) |

(52) U.S. Cl.
CPC ............ *G11C 16/28* (2013.01); *G11C 11/5642* (2013.01); *G11C 16/24* (2013.01); *G11C 16/3404* (2013.01)

(58) Field of Classification Search
CPC .... G11C 16/28; G11C 16/3404; G11C 16/24; G11C 11/15642
USPC ........................ 365/185.21, 185.18
See application file for complete search history.

(56) References Cited

U.S. PATENT DOCUMENTS

| | | | |
|---|---|---|---|
| 7,266,016 B2* | 9/2007 | Kameda ................. | 365/185.18 |
| 7,551,477 B2* | 6/2009 | Mokhlesi et al. ........ | 365/185.11 |
| 7,643,347 B2* | 1/2010 | Abiko et al. ............. | 365/185.17 |
| 7,948,797 B2  | 5/2011 | Suzuki et al. | |
| 8,116,139 B2* | 2/2012 | Kuo et al. ................ | 365/185.18 |
| 8,130,556 B2* | 3/2012 | Lutze et al. ............ | 365/189.011 |
| 8,254,168 B2* | 8/2012 | Suzuki et al. ............ | 365/185.03 |
| 8,385,129 B2* | 2/2013 | Honda ..................... | 365/185.21 |
| 8,391,043 B2* | 3/2013 | Shim et al. ..................... | 365/63 |
| 8,395,936 B2* | 3/2013 | Li et al. .................... | 365/185.03 |
| 8,885,428 B2* | 11/2014 | Chen et al. .................... | 365/207 |

(Continued)

FOREIGN PATENT DOCUMENTS

| | | |
|---|---|---|
| JP | 2009-43357 A | 2/2009 |
| JP | 2009-230777 A | 10/2009 |

(Continued)

OTHER PUBLICATIONS

Office Action issued Jun. 18, 2015 in Japanese Patent Application No. 2012-148618 (with English language translation).

*Primary Examiner* — Viet Q Nguyen
(74) *Attorney, Agent, or Firm* — Oblon, McClelland, Maier & Neustadt, L.L.P.

(57) ABSTRACT

In general, according to one embodiment, a semiconductor memory device includes a first transistor, a plurality of memory cells and a controller. One end of the first transistor is electrically connected to a first power supply. The plurality of memory cells are electrically connected between other end of the first transistor and a second power supply. The controller is configured to apply a first voltage to a gate of the first transistor when reading data from a selected memory cell. The controller is configured to make the first voltage progressively-increasing.

19 Claims, 8 Drawing Sheets

PROGRAMMING OPERATION SEQUENCE

READ-OUT OPERATION SEQUENCE

(56) References Cited

U.S. PATENT DOCUMENTS

| | | |
|---|---|---|
| 2009/0040835 A1 | 2/2009 | Ogawa |
| 2010/0315878 A1* | 12/2010 | Edahiro .................. 365/185.21 |
| 2010/0322012 A1* | 12/2010 | Suzuki et al. ............ 365/185.24 |
| 2011/0075485 A1 | 3/2011 | Fukuda et al. |
| 2011/0122695 A1* | 5/2011 | Li et al. .................... 365/185.05 |
| 2011/0157996 A1* | 6/2011 | Honda ..................... 365/185.21 |
| 2014/0003154 A1* | 1/2014 | Abe et al. ................. 365/185.21 |
| 2014/0043907 A1* | 2/2014 | Fujimura ................. 365/185.11 |
| 2014/0269070 A1* | 9/2014 | Hsiung et al. ............ 365/185.11 |

FOREIGN PATENT DOCUMENTS

| | | |
|---|---|---|
| JP | 2011-70725 A | 4/2011 |
| JP | 2012-53980 A | 3/2012 |

\* cited by examiner

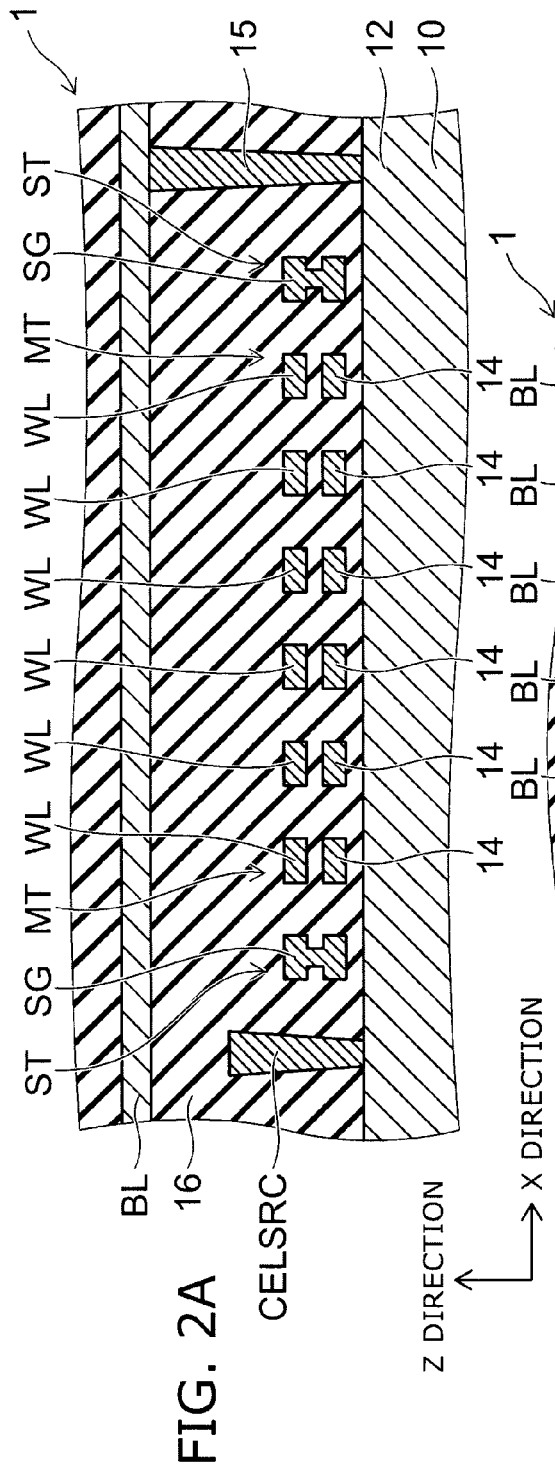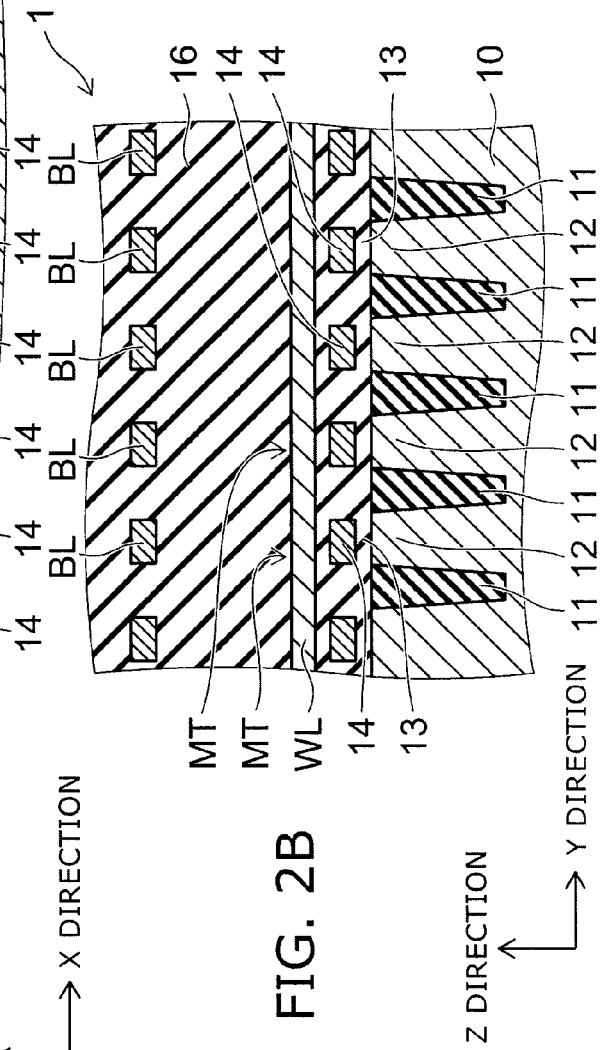

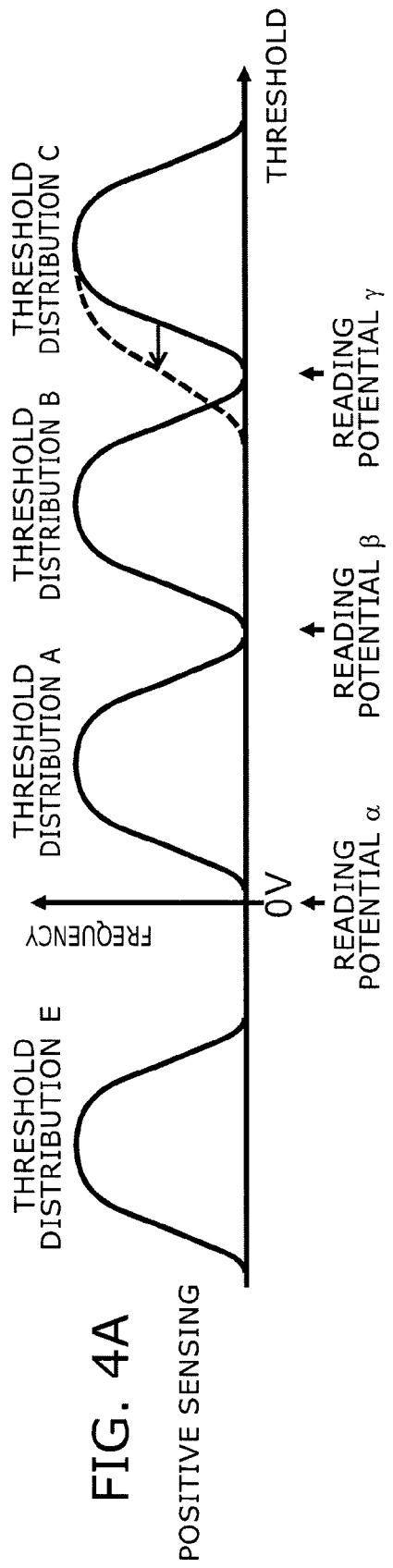
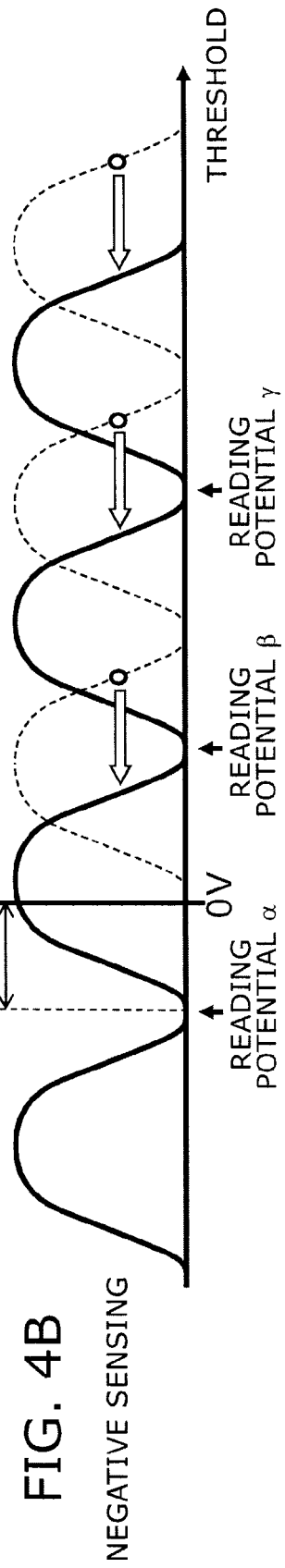
FIG. 4A POSITIVE SENSING
FIG. 4B NEGATIVE SENSING

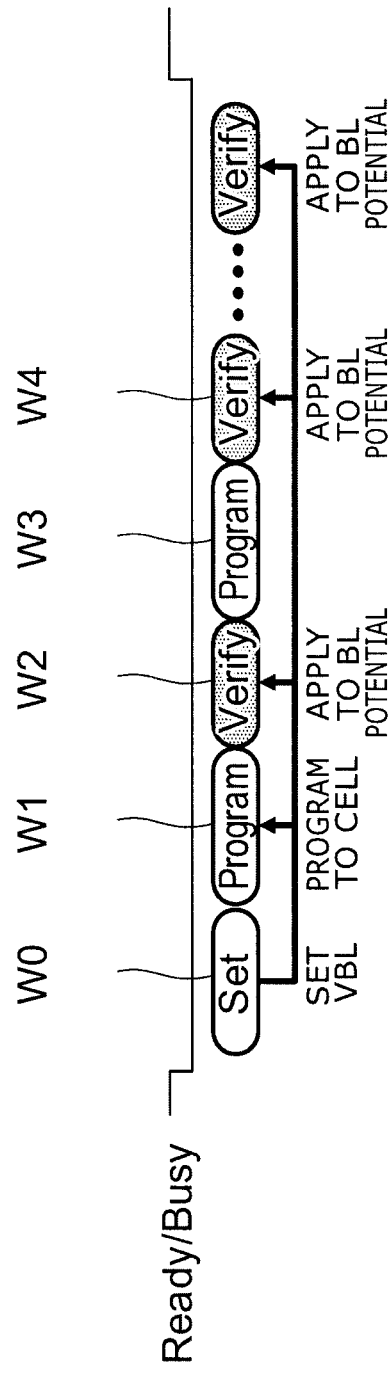
FIG. 7A PROGRAMMING OPERATION SEQUENCE
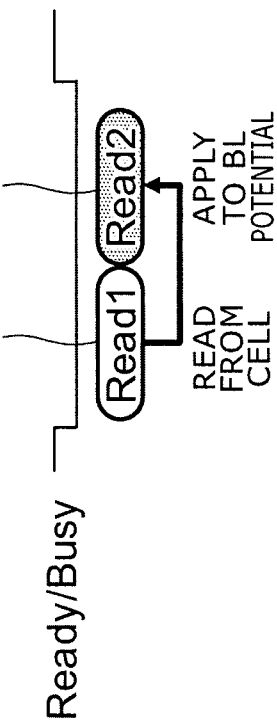
FIG. 7B READ-OUT OPERATION SEQUENCE

SEMICONDUCTOR MEMORY DEVICE

CROSS-REFERENCE TO RELATED APPLICATIONS

This application is based upon and claims the benefit of priority from the prior Japanese Patent Application No. 2012-148618, filed on Jul. 2, 2012; the entire contents of which are incorporated herein by reference.

FIELD

Embodiments described herein relate generally to a semiconductor memory device.

BACKGROUND

In NAND flash memory which is one type of semiconductor memory device, data is programmed by changing the threshold of a memory cell transistor by storing a charge in a floating gate electrode. On the other hand, the data that is programmed is read by applying a prescribed potential to the control electrode of the memory cell transistor and determining whether the memory cell transistor is in an ON state in which a current flows or an OFF state in which the current does not flow.

BRIEF DESCRIPTION OF THE DRAWINGS

FIGS. 2A and 2B are cross-sectional views showing memory cell transistors of the semiconductor memory device according to the first embodiment;

FIGS. 4A and 4B are graphs showing the threshold distributions of the memory cell transistors;

FIG. 7A shows the sequence of the programming operation of the second embodiment; and FIG. 7B shows the sequence of the read-out operation.

DETAILED DESCRIPTION

In general, according to one embodiment, a semiconductor memory device includes a first transistor, a plurality of memory cells and a controller. One end of the first transistor is electrically connected to a first power supply. The plurality of memory cells are electrically connected between other end of the first transistor and a second power supply. The controller is configured to apply a first voltage to a gate of the first transistor when reading data from a selected memory cell. The controller is configured to make the first voltage progressively-increasing.

In general, according to one embodiment, a semiconductor memory device includes a first transistor, a plurality of word lines, a plurality of memory cells, and a controller. One end of the first transistor is electrically connected to a first power supply. The controller is configured to apply a first voltage to a gate of the first transistor being set for each of groups when reading data from a selected memory cell. Each group is made of a plurality of the memory cells configured to share one of the word lines.

In general, according to one embodiment, an operation method of a semiconductor memory device includes reading data from a memory cell. A gate potential of a first transistor is progressively-increasing. The first transistor is electrically connected between a first power supply and the memory cell.

Embodiments of the invention will now be described with reference to the drawings.

First, a first embodiment will be described.

Figure 1:
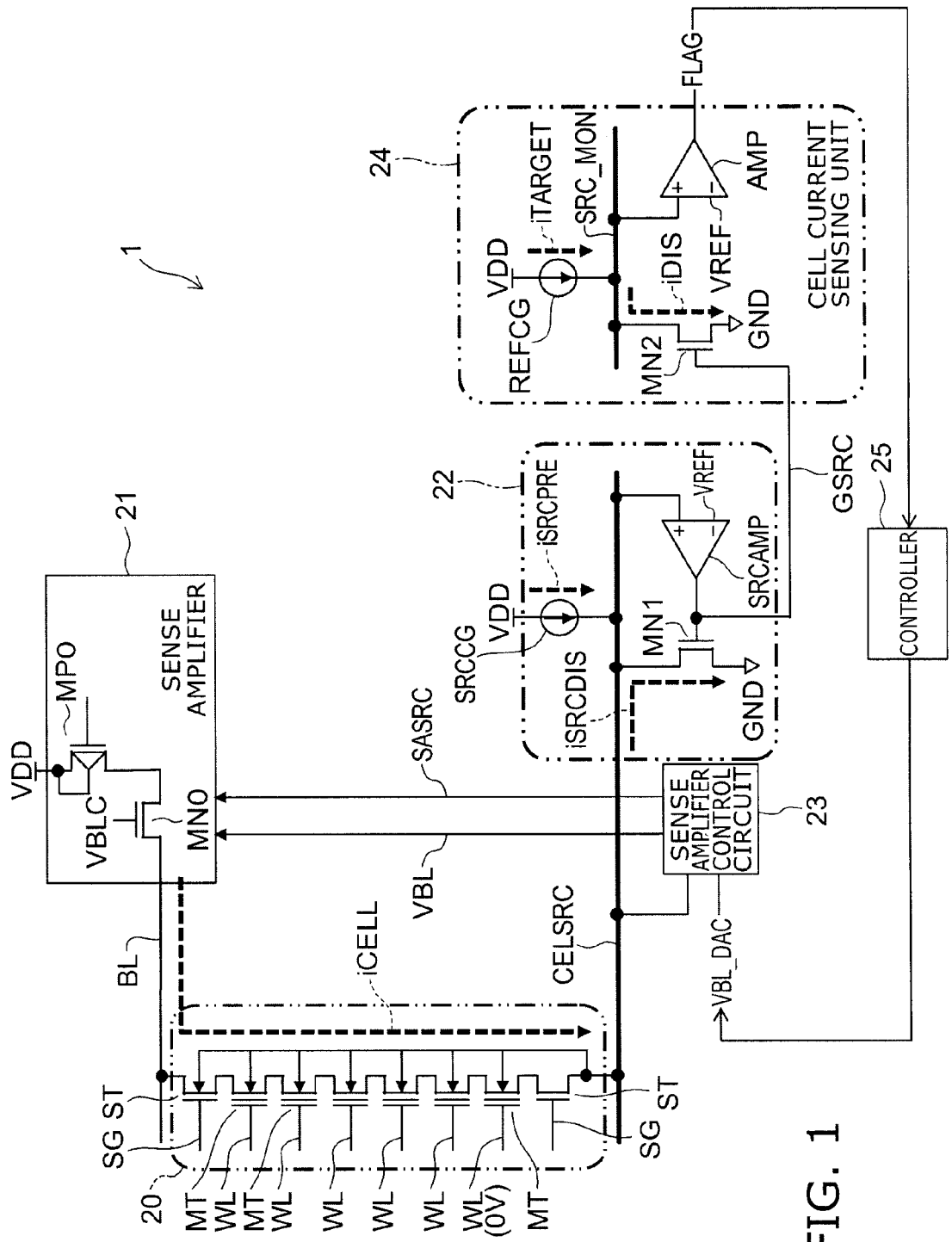
FIG. 1 is a circuit diagram showing a semiconductor memory device according to a first embodiment.

FIG. 1 is a circuit diagram showing a semiconductor memory device according to the embodiment.

FIGS. 2A and 2B are cross-sectional views showing memory cell transistors of the semiconductor memory device according to the embodiment.

The semiconductor memory device according to the embodiment is NAND flash memory.

As shown in FIG. 1, the semiconductor memory device 1 according to the embodiment includes a memory cell unit 20, a sense amplifier 21, a source potential adjustment circuit 22, a sense amplifier control circuit 23, a cell current sensing unit 24, and a controller 25. The memory cell unit 20 includes multiple NAND strings. Each of the NAND strings includes multiple memory cell transistors MT that are connected in series, and a pair of selection transistors ST connected to two ends of the column made of the multiple memory cell transistors MT.

Although multiple bit lines BL and multiple word lines WL are provided in the embodiment, only one bit line BL is shown in FIG. 1 for convenience of illustration. Only one source line CELSRC is provided in one block. The configuration of each of the portions will now be described.

1. Memory Cell Unit 20

As shown in FIGS. 2A and 2B, a silicon substrate 10 is provided in the semiconductor memory device 1. In the memory cell unit 20, multiple STIs (shallow trench isolation) 11 are formed in the upper layer portion of the silicon substrate 10 to extend in one direction (hereinbelow, called the X direction); and the portions of the upper layer portion of the silicon substrate 10 between the STIs 11 are active areas 12. Gate insulating films 13 are provided on the active areas 12; and charge storage layers 14 are provided on the gate insulating films 13. Although the charge storage layers 14 are floating gate electrodes made of polysilicon into which, for example, an impurity is added, a film made of silicon nitride may be used. In such a case, a MONOS (metal-oxide-nitride-oxide-silicon) structure is realized. The charge storage layers 14 are arranged intermittently along the X direction in the regions directly above the active areas 12. Accordingly, the charge storage layers 14 are arranged in a matrix configuration along both the X direction and a direction (hereinbelow, called the Y direction) orthogonal to the X direction in the regions directly above the multiple active areas 12.

The word lines WL are multiply provided on the charge storage layers 14 to extend in the Y direction. Selection gate lines SG are provided on two sides of a set made of the multiple word lines WL to extend in the Y direction. A bit line contact 15 extending in a direction (hereinbelow, called the Z direction) orthogonal to the X direction and the Y direction is provided on one side of the group including the set made of the multiple word lines WL and the pair of selection gate lines SG disposed on the two sides of the set as viewed from the group; and the lower end of the bit line contact 15 is connected to the active area 12. On the other hand, the source line CELSRC extending in the Y direction is provided on the other side as viewed from the group described above; and the lower end of the source line CELSRC is connected to the active area 12. The bit line BL extending in the X direction is provided in the region directly above each of the active areas 12 above the word lines WL, the selection gate lines SG, and the source line CELSRC and is connected to the upper end of the bit line contact 15. An inter-layer insulating film 16 is provided on the silicon substrate 10 to cover the charge storage layers 14, the word lines WL, the selection gate lines SG, the bit line contact 15, the source line CELSRC, and the bit line BL.

Thereby, in the memory cell unit 20, when viewed in the top view, the memory cell transistor MT including one charge storage layer 14 is formed at each intersection between each of the active areas 12 and each of the word lines WL. Accordingly, the multiple memory cell transistors MT are arranged in a matrix configuration along the X direction and the Y direction in the memory array region. Also, the selection transistor ST is formed at each intersection between each of the active areas 12 and each of the selection gate lines SG. Accordingly, the selection transistor ST, the multiple memory cell transistors MT, and the selection transistor ST are connected in series in this order between the bit line BL and the source line CELSRC. The memory cell transistors MT and the selection transistors ST are, for example, n-channel transistors.

The set made of the multiple memory cell transistors MT that share one word line WL is called a page; and the group made of the multiple memory cell transistors MT connected to one source line is called a block. The current flowing in one source line CELSRC from the multiple bit lines BL via the memory cell transistors MT in the read-out operation of the data is called a cell current iCELL. The current flowing in the source line CELSRC from each of the bit lines BL in the case where the memory cell transistor MT to be read is in the ON state is called the ON cell current; and the current flowing in the source line CELSRC from each of the bit lines BL in the case where the memory cell transistor MT to be read is in the OFF state is called the OFF cell current. The cell current iCELL is the sum total of the ON cell currents and the OFF cell currents flowing in all of the bit lines BL connected to the source line CELSRC.

2. Sense Amplifier 21

Returning now to FIG. 1, the sense amplifier 21 will be described.

The same number of sense amplifiers 21 as bit lines BL are provided. For example, 256K sense amplifiers 21 are provided.

The sense amplifiers 21 can retain page-sized data. In the read-out operation, the sense amplifiers 21 sense the data by sensing/amplifying the cell current flowing in, for example, one page of bit lines BL connected to the memory cell transistors to be read; and the data that is sensed is transferred to a page buffer (not shown). In the programming operation, the sense amplifiers 21 receive the data of one page from the page buffer and transfer the desired voltage to the bit lines BL according to the data of each bit.

The sense amplifier 21 includes a p-channel PMOS transistor MP0, an n-channel NMOS transistor MN0, and a latch circuit (not shown). The source of the PMOS transistor MP0 is electrically connected to a power supply potential VDD (the first power supply potential) which is positive; and the drain of the PMOS transistor MP0 is connected to the drain of the NMOS transistor MN0. The source of the NMOS transistor MN0 is connected to the bit line BL; and a voltage VBLC is supplied to the gate of the NMOS transistor MN0. A sentence "electrically connected" means both of "directly connected" and "indirectly connected" via something, for example other transistor. "Electrically connected" may be described just "connected" for short in the specification.

Thereby, the power supply potential VDD, the PMOS transistor MP0, the NMOS transistor MN0, and the bit line BL are connected in series in this order. The PMOS transistor MP0 is a switching element that switches between connecting or not connecting the power supply potential VDD to the bit line BL; and the NMOS transistor MN0 is a current control transistor (a first transistor) that controls the magnitude of the current caused to flow in the bit line BL by controlling the potential of the bit line BL.

The latch circuit can retain the data of the memory cell transistor MT.

3. Source Potential Adjustment Circuit 22

The source potential adjustment circuit 22 is a circuit that maintains the potential of the source line CELSRC at a prescribed potential. The same number of source potential adjustment circuits 22 as source lines CELSRC are provided. For example, one source potential adjustment circuit 22 is provided for one block. The source potential adjustment circuit includes a constant current source SRCCG, an NMOS transistor MN1 (a second transistor), and an op-amp SRCAMP (a potential application unit).

The constant current source SRCCG functions to supply a keeper current iSRCPRE to the source line CELSRC. The constant current source SRCCG is connected between the power supply potential VDD and the source line CELSRC.

The drain of the NMOS transistor MN1 is connected to the source line CELSRC; and the source of the NMOS transistor MN1 is connected to a ground potential GND (a second power supply potential). The positive input terminal of the op-amp SRCAMP is connected to the source line CELSRC; a reference potential VREF is input to the negative input terminal of the op-amp SRCAMP; and the output terminal of the op-amp SRCAMP is connected to the gate electrode (the control electrode) of the NMOS transistor MN1.

4. Sense Amplifier Control Circuit 23

The sense amplifier control circuit 23 is a circuit that controls the potential that is transferred to the bit lines BL. The same number of sense amplifier control circuits 23 as source lines CELSRC are provided. For example, one sense amplifier control circuit 23 is provided for one block. The sense amplifier control circuit 23 receives a signal VBL_DAC that represents the potential of the source line CELSRC and the potential to be transferred to the bit lines BL and supplies a potential VBL to be transferred to the bit lines BL and a reference potential SASRC to the sense amplifier 21.

Here, the signal VBL_DAC is, for example, a digital signal of four bits. The sense amplifier control circuit 23 generates the reference potential SASRC of the sense amplifier 21 and the potential VBL to be applied to the bit lines BL based on the potential of the source line CELSRC and the signal VBL_DAC.

5. Cell Current Sensing Unit 24

The cell current sensing unit 24 is a circuit that compares the magnitude of the cell current iCELL to the magnitude of a reference current iTARGET. The same number of cell current sensing units 24 as source lines CELSRC are provided. For example, one cell current sensing unit 24 is provided for one block. The cell current sensing unit 24 includes a pseudo-source line SRC_MON, a reference current source REFCG, an NMOS transistor MN2, and an op-amp AMP. The reference current source REFCG, the NMOS transistor MN2, and the op-amp AMP are connected independently to the pseudo-source line SRC_MON and are electrically isolated from other portions. It is sufficient for the pseudo-source line SRC_MON to be a node having some potential; and it is not always necessary for the pseudo-source line SRC_MON to be a conductive member having an interconnect configuration.

The reference current source REFCG is connected between the power supply potential VDD and the pseudo-source line SRC_MON and is a circuit that supplies the reference current iTARGET to the pseudo-source line SRC_MON. The drain of the NMOS transistor MN2 is connected to the pseudo-source line SRC_MON; the source of the NMOS transistor MN2 is connected to the ground potential GND; and the same potential as that of the gate electrode of the NMOS transistor MN1, i.e., the output potential of the op-amp SRCAMP, is applied to the gate electrode (the control electrode) of the NMOS transistor MN2. Thereby, the NMOS transistor MN2 functions as a current control transistor (a third transistor) that controls the current flowing from the pseudo-source line SRC_MON to the ground potential GND. The conductivity type and the characteristics of the NMOS transistor MN2 are the same as the conductivity type and the characteristics of the NMOS transistor MN1. The positive input terminal of the op-amp AMP is connected to the pseudo-source line SRC_MON; the reference potential VREF is input to the negative input terminal of the op-amp AMP; and the op-amp AMP is a comparison unit that outputs the comparison result of the reference potential VREF and the potential of the pseudo-source line SRC_MON as an output signal FLAG. The output signal FLAG is, for example, a binary digital signal.

6. Controller 25

The controller 25 is a circuit that generates the signal VBL_DAC based on the value of the output signal FLAG and outputs the signal VBL_DAC to the sense amplifier control circuit 23. The controller 25 is, for example, the control circuit of the entire semiconductor memory device 1; and one controller 25 is provided for the entire semiconductor memory device 1.

Operations of the semiconductor memory device 1 according to the embodiment will now be described.

<1> Programming Operation and Read-Out Operation

First, the basic operations as a memory, i.e., the programming operation and the read-out operation of the data, will be described.

As shown in FIG. 1 and FIGS. 2A and 2B, when programming the data to the memory cell transistor MT, the threshold of the memory cell transistor MT is changed by causing the charge storage layer 14 to store charge by injecting electrons from the active area 12 into the charge storage layer 14. For example, in the case where binary data is programmed to n-channel memory cell transistors MT, the charge is not injected into the charge storage layers 14 of the memory cell transistors MT to be programmed with a value of "1;" and the thresholds of the memory cell transistors MT to be programmed with the value of "1" are left as-is with the low value. On the other hand, the charge is injected into the charge storage layers 14 of the memory cell transistors MT to be programmed with a value of "0;" and the thresholds of the memory cell transistors MT to be programmed with the value of "0" are increased. Thereby, the threshold of the memory cell transistor MT has two levels. Also, in the case where multi-bit data, e.g., data of four values, is programmed to the memory cell transistor MT, the amount of charge that is injected is differentiated into three levels; and the threshold of the memory cell transistor MT has four levels. The data that was previously programmed is erased when overwriting new data to the memory cell transistors MT. For example, the charge is drained from the charge storage layers 14; and the thresholds of the charge storage layers 14 become the lowest level.

On the other hand, when reading the data programmed to one of the memory cell transistors MT, a prescribed reading potential is applied to the control electrode of the memory cell transistor MT, i.e., the word line WL. The reading potential is a potential that is lower than the threshold of the memory cell transistor MT programmed with the value of "1" and higher than the threshold of the memory cell transistor MT programmed with the value of "0." A potential that is sufficiently high enough that the memory cell transistors MT are switched to the ON state is applied to the remaining word lines WL. In the sense amplifiers 21 in this state, the potential is applied simultaneously to all of the bit lines BL by switching the PMOS transistor MP0 to the ON state by applying the ground potential GND to the gate electrode of the PMOS transistor MP0. As a result, the current flows from the sense amplifiers 21 to the source line CELSRC by way of the bit lines BL, the bit line contacts 15, and the active areas 12. As described below, in the read-out operation in the embodiment, the potential of the bit lines BL is controlled by controlling the degree of the conduction of the NMOS transistor MN0 by controlling the gate potential VBLC (the control potential) of the NMOS transistor MN0.

In the case where the value of "1" is programmed to the memory cell transistor MT to be read, the current (the ON cell current) that flows is relatively large because the memory cell transistor MT is in the ON state. On the other hand, in the case where the value of "0" is programmed to the memory cell transistor MT, the current (the OFF cell current) that flows is relatively small because the memory cell transistor MT is in the OFF state. Accordingly, the value programmed to the memory cell transistor MT can be read by the sense amplifier 21 sensing the magnitude of the current flowing in the bit line BL. In the case where the data of the four values is programmed to the memory cell transistor MT, the reading potential applied to the word line WL has three levels; and the four values are differentiated by determining whether the memory cell transistor MT is in the ON state or the OFF state for each of the levels. The magnitude of the cell current iCELL fluctuates by data pattern because the cell current iCELL is the sum total of the current (the ON cell current or the OFF cell current) flowing in each of the bit lines BL.

<2> Problems in the Case where the Bit Line Potential is Fixed

Problems in the case where the bit line potential is fixed in the read-out operation described above will now be described.

If the voltage between the source line CELSRC and the bit lines BL is fixed in the read-out operation, the ON cell current undesirably decreases over time due to the degradation of the elements as the programming and erasing (W/E) of the data is repeated. This phenomenon will now be described.

Figures 3A, 3B, 3C:
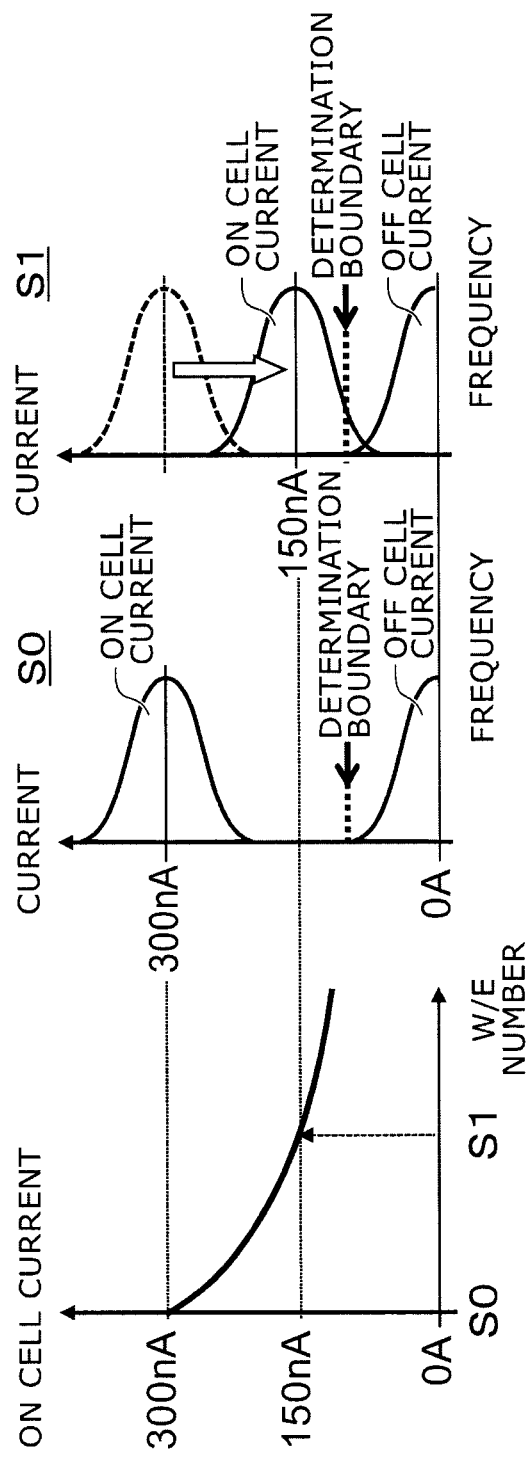
FIG. 3A is a graph showing the change over time of the current distribution.
FIGS. 3B and 3C are graphs showing the distributions of the ON cell current and the OFF cell current.

FIG. 3A is a graph showing the change over time of the current distribution, where the horizontal axis is the W/E number, and the vertical axis is the magnitude of the ON cell current. FIGS. 3B and 3C are graphs showing the distributions of the ON cell current and the OFF cell current, where the horizontal axis is the frequency, and the vertical axis is the current. FIG. 3B shows an unused state S0; and FIG. 3C shows a used state S1.

Usually, as shown in FIGS. 3A to 3C, the magnitudes of the ON cell current and the OFF cell current have normal distributions. In the unused state S0, e.g., when shipped from the factory, the median of the ON cell current is 300 nA (nanoamperes); the median of the OFF cell current is 0 nA; one half of the distribution width of the ON cell current is about 80 nA;

and one half of the distribution width of the OFF cell current is about 80 nm. In such a case, because the distribution of the ON cell current substantially does not overlap the distribution of the OFF cell current, the values of the data can be determined accurately if the determination boundary is set to be between the two distributions.

However, when the median of the ON cell current decreases to 150 nA in the used state S1, the lower tail of the distribution of the ON cell current overlaps the upper tail of the distribution of the OFF cell current; and read-out errors occur undesirably at a constant rate no matter how the determination boundary is set. Then, as the W/E number increases, the ON cell current as an entirety decreases; the overlapping portion of the distribution of the ON cell current and the distribution of the OFF cell current increases; and the occurrence rate of the read-out errors increases. In the case where the occurrence rate of the read-out errors exceeds the tolerable limit that can be corrected by ECC, the NAND flash memory becomes unusable. Stated conversely, the W/E number where the occurrence rate of the read-out errors reaches the tolerable limit is the typical value of the W/E number of the memory. For NAND flash memory, the typical value of the W/E number is defined as a reliability specification of the product and must not be less than a constant value.

To increase the typical value of the W/E number, it may be considered to reduce the decrease rate of the ON cell current with respect to the W/E number, that is, reduce the absolute value of the slope of the graph of FIG. 3A, or to set the bit line potential to be high to anticipate the decrease of the ON cell current. However, it is difficult to drastically increase the decrease rate of the ON cell current with respect to the W/E number because the decrease rate of the ON cell current depends on physical factors such as the materials included in the memory, the patterning precision of the manufacturing processes, etc. On the other hand, although the typical value of the W/E number increases in the case where the bit line potential is set to be high, the ON cell current increases and the current consumption becomes undesirably large. In particular, the current consumption undesirably becomes unnecessarily large in the state that includes the unused state S0 when the W/E number is small.

To increase the throughput of the data in the embodiment, the potential is applied simultaneously to all of the bit lines BL; and the data is read simultaneously from the multiple memory cell transistors MT that share one of the word lines WL. This method is called ABL sensing. Therefore, even if the magnitude of the ON cell current flowing in one memory cell transistor is 300 nA, the cell current iCELL reaches 80 mA (milliamperes) if the number of the memory cell transistors that share one word line is 256K. Further, in ABL sensing, it is necessary for the potentials of all of the bit lines to be equal to each other in the read-out operation so that the bit lines do not cause mutual potential interference. Stated conversely, the read-out operation is started after the potentials of the bit lines BL reach an equilibrium state. Therefore, the cell current continues to flow during the interval of about 20 to 30 μs (microseconds) from the charging start of the bit lines to the completion of the read-out, which accounts for the greater part of the current consumption of the read-out operation and verify operation.

<3> Method for Solving the Problems

Therefore, in the semiconductor memory device 1 according to the embodiment as shown in FIG. 1, the magnitude of the cell current iCELL is compared to the magnitude of the reference current iTARGET and it is possible to control the magnitude of the cell current iCELL by providing the source potential adjustment circuit 22, the sense amplifier control circuit 23, the cell current sensing unit 24, and the controller 25. This operation will now be described.

<3-1> Determination of the Magnitude of the Cell Current

First, a method for determining the magnitude of the cell current iCELL will be described.

As shown in FIG. 1, the constant current source SRCCG of the source potential adjustment circuit 22 supplies the constant keeper current iSRCPRE to the source line CELSRC. Thereby, the cell current iCELL is caused to flow into the source line CELSRC from the multiple bit lines BL; and the keeper current iSRCPRE flows into the source line CELSRC from the constant current source SRCCG. On the other hand, a discharge current iSRCDIS flows out from the source line CELSRC toward the ground potential GND via the NMOS transistor MN1. Therefore, the potential of the source line CELSRC fluctuates due to the balance between the cell current iCELL and the keeper current iSRCPRE that flow in and the discharge current iSRCDIS that flows out.

The keeper current iSRCPRE is a charging current that maintains the potential of the source line CELSRC at the prescribed potential and is supplied constantly when all or the greater part of the values stored in the multiple memory cell transistors MT to be read simultaneously, i.e., the multiple memory cell transistors MT that share one word line WL, are "0" and the cell current iCELL has become extremely small. Normally, because the keeper current iSRCPRE is markedly small compared to the cell current iCELL, the cell current iCELL is substantially equal to the discharge current iSRCDIS when the potential of the source line CELSRC is a constant potential. In one example, the magnitude of the keeper current iSRCPRE is several hundred μA (microamperes) which is about 1/100 of the maximum value of the cell current iCELL in the case where the magnitude of the cell current iCELL has a maximum of about 80 mA.

The magnitude of the discharge current iSRCDIS is controlled by the NMOS transistor MN1. The degree of the conduction of the NMOS transistor MN1 is controlled by an output signal GSRC of the op-amp SRCAMP. The output signal GSRC is an analog signal that represents the comparison result of the reference potential VREF and the potential of the source line CELSRC from the op-amp SRCAMP. Accordingly, as the potential of the source line CELSRC increases compared to the reference potential VREF, the value of the output signal GSRC becomes positive and large; the degree of the conduction of the NMOS transistor MN1 increases; the discharge current iSRCDIS increases; and as a result, the potential of the source line CELSRC decreases. Conversely, as the potential of the source line CELSRC decreases compared to the reference potential VREF, the value of the output signal GSRC becomes negative and large; the degree of the conduction of the NMOS transistor MN1 decreases; the discharge current iSRCDIS decreases; and as a result, the potential of the source line CELSRC increases. Thus, the feedback control of the potential of the source line CELSRC is continuously performed to cause the potential of the source line CELSRC to approach the reference potential VREF.

On the other hand, in the cell current sensing unit 24, the reference current iTARGET flows from the reference current source REFCG into the pseudo-source line SRC_MON. On the other hand, a discharge current iDIS flows out from the pseudo-source line SRC_MON via the NMOS transistor MN2. Therefore, the potential of the pseudo-source line SRC_MON fluctuates due to the balance between the reference current iTARGET that flows in and the discharge current iDIS that flows out. In the case where the potential of the pseudo-source line SRC_MON is higher than the reference potential VREF, the output signal FLAG of the op-amp AMP becomes "H." On the other hand, in the case where the potential of the pseudo-source line SRC_MON is lower than the reference potential VREF, the output signal FLAG of the op-amp AMP becomes "L."

The magnitude of the reference current iTARGET is set to be the target value of the cell current iCELL. The operations of NMOS transistor MN2 and the NMOS transistor MN1 are lined to each other because the output signal GSRC of the op-amp SRCAMP is input to both the gate electrode of the NMOS transistor MN1 and the gate electrode of the NMOS transistor MN2. Because the characteristics of the NMOS transistor MN2 are equal to the characteristics of the NMOS transistor MN1, the discharge current iDIS is equal to the discharge current iSRCDIS. Therefore, if the magnitude of the cell current iCELL is equal to the magnitude of the reference current iTARGET, the potential of the pseudo-source line SRC_MON is substantially equal to the reference potential VREF because the ratios of the inflowing current and the outflowing current to and from the pseudo-source line SRC_MON are substantially equal to the ratios of the inflowing current and the outflowing current to and from the source line CELSRC.

Summarizing the description recited above, the cell current iCELL is substantially equal to the discharge current iSRCDIS because the potential of the source line CELSRC is maintained to be substantially constant by the NMOS transistor MN1 and the op-amp SRCAMP. As described above, the discharge current iSRCDIS is equal to the discharge current iDIS. Therefore, if the cell current iCELL becomes larger than the reference current iTARGET, the discharge current iDIS becomes larger than the reference current iTARGET; and the potential of the pseudo-source line SRC_MON decreases to become lower than the reference potential VREF. As a result, the value of the output signal FLAG of the op-amp AMP becomes "L." On the other hand, if the cell current iCELL becomes smaller than the reference current iTARGET, the discharge current iDIS becomes smaller than the reference current iTARGET; and the potential of the pseudo-source line SRC_MON increases to become higher than the reference potential VREF. As a result, the value of the output signal FLAG of the op-amp AMP becomes "H." Thus, the magnitude of the cell current iCELL can be determined by the value of the output signal FLAG using the magnitude of the reference current iTARGET as a reference.

<3-2> Control of the Magnitude of the Cell Current

A method for controlling the magnitude of the cell current based on the determination result of the magnitude of the cell current described above will now be described.

The output signal FLAG that is output from the op-amp AMP of the cell current sensing unit 24 is input to the controller 25. Then, the controller 25 generates the signal VBL_DAC that represents the potential to be applied to the bit lines BL based on the value of the output signal FLAG and outputs the signal VBL_DAC to the sense amplifier control circuit 23. The sense amplifier control circuit 23 generates the reference potential SASRC of the sense amplifier 21 and the potential VBL to be applied to the bit lines BL based on the signal VBL_DAC and the potential of the source line CELSRC and outputs the potential VBL and the reference potential SASRC to the sense amplifier 21. The sense amplifier 21 controls the gate potential VBLC of the NMOS transistor MN0 based on the potential VBL. Thereby, the degree of the conduction of the NMOS transistor MN0 is controlled to control the potential (the bit line potential) of the bit line BL to be the potential VBL. In other words, the potential VBL generated by the sense amplifier control circuit 23 is actually applied to the bit lines BL. When the bit line potential is controlled, the drain-source current is controlled to control the ON cell current because the drain-source voltage of the memory cell transistors to be read is controlled.

More specifically, when the value of the output signal FLAG is "L," that is, when the cell current iCELL is larger than the reference current iTARGET, the controller 25 continuously reduces the value of the signal VBL_DAC to cause the sense amplifier control circuit 23 to reduce the potential VBL. Thereby, the sense amplifier 21 reduces the gate potential VBLC of the NMOS transistor MN0 to reduce the bit line potential. As a result, the cell current iCELL decreases. When the cell current iCELL decreases, the discharge current iSRCDIS also decreases; the discharge current iDIS also decreases in conjunction with the discharge current iSRCDIS; the potential of the pseudo-source line SRC_MON increases; and the value of the output signal FLAG switches from "L" to "H." At this point in time, the controller 25 fixes the value of the signal VBL_DAC.

On the other hand, when the value of the output signal FLAG is "H," that is, when the cell current iCELL is smaller than the reference current iTARGET, the controller 25 continuously increases the value of the signal VBL_DAC to cause the sense amplifier control circuit 23 to increase the potential VBL. Thereby, the sense amplifier 21 increases the gate potential VBLC of the NMOS transistor MN0 to increase the potential of the bit line BL. As a result, the cell current iCELL increases. When the cell current iCELL increases, the discharge current iDIS also increases; the potential of the pseudo-source line SRC_MON is reduced; and the value of the output signal FLAG switches from "H" to "L." At this point in time, the controller 25 fixes the value of the signal VBL_DAC.

Thus, the appropriate bit line potential can be discovered and the magnitude of the cell current iCELL can be caused to converge to the magnitude of the reference current iTARGET by changing the value of the signal VBL_DAC until the value of the output signal FLAG switches. As a result, as shown in FIG. 3A, the cell current iCELL can be reduced by reducing the bit line potential at the stage where the W/E number is still small; and the necessary cell current iCELL can be ensured by increasing the bit line potential when the memory degrades as the W/E number increases. In such a case, the control potential, i.e., the gate potential VBLC applied to the control electrode of the NMOS transistor MN0 when reading the data from the memory cell transistors MT, changes in the direction of increasing the degree of the conduction of the NMOS transistor MN0 over time for the entire usable life of the semiconductor memory device 1. In the embodiment, the magnitude of the cell current is determined and the magnitude of the cell current is controlled for each set made of one page, i.e., the plurality of the memory cell transistors MT that share one word line WL. Therefore, the gate potential VBLC is set for each set made of the plurality of the memory cell transistors MT that share one word line WL.

<4> Positive CELSRC Method

An operation will now be described in which a portion of the reading potential can be a negative potential without applying a negative potential to the word line WL in the case where each of the memory cell transistors MT stores multi-bit data (three values or more).

FIGS. 4A and 4B are graphs showing the threshold distributions of the memory cell transistors, where the horizontal axis is the threshold, and the vertical axis is the frequency. FIG. 4A shows positive sensing; and FIG. 4B shows negative sensing.

The case where four values (two bits) of data are stored in the memory cell transistor MT will now be described as an example.

In the case where the four values of data are stored in the memory cell transistor MT as shown in FIGS. 4A and 4B, the threshold distribution of the memory cell transistors MT is divided into four levels. Namely, there exist a threshold distribution E in which the charge is not stored in the charge storage layer 14, and three threshold distributions A, B, and C that are produced by injecting the charge into the charge storage layer 14. The reading potential to differentiate the threshold distribution E and the threshold distribution A is taken as a reading potential α; the reading potential to differentiate the threshold distribution A and the threshold distribution B is taken as a reading potential β; and the reading potential to differentiate the threshold distribution B and the threshold distribution C is taken as a reading potential γ.

FIG. 4A shows positive sensing. Positive sensing is a method in which all of the threshold distributions produced by injecting the charge, i.e., the threshold distributions A, B, and C other than the threshold distribution E, are not less than 0 V. Thereby, all of the reading potentials α, β, and γ can be 0 V or more. The medians of the threshold distributions are controllable by adjusting the programming voltage.

In positive sensing, it is unnecessary to provide a voltage step-up circuit of a negative potential because all of the reading potentials α, β, and γ can be 0 V or more. Moreover, it is unnecessary to modify the manufacturing processes to separate the p-type well to which the negative potential is applied from the p-type well to which the ground potential is applied. Thus, positive sensing has the advantage that the configuration and the manufacturing processes of the semiconductor memory device are simple; and the cost is therefore low.

On the other hand, because the threshold distribution on the high potential side is greatly distal to the neutral state in positive sensing, it becomes difficult to retain the charge over a long period of time in the case where the memory cell transistors are downscaled. For example, as illustrated by the broken line in FIG. 4A, the highest threshold distribution C undesirably shifts downward to overlap the threshold distribution B in the case where the memory cell transistors are left for a long period of time. In such a case, read-out errors occur when reading the data using the reading potential γ. Thus, positive sensing has the disadvantage that it becomes difficult to ensure the reliability as the downscaling of the memory cells progresses and multi-bit memory cells are used.

On the other hand, FIG. 4B shows negative sensing. Negative sensing is a method in which a portion of the threshold distribution has a negative potential by reducing the potentials of the threshold distributions A, B, and C as an entirety. In the example shown in FIG. 4B, a portion of the threshold distribution A has a negative potential. Thereby, compared to positive sensing, the absolute potentials of the threshold distributions A, B, and C can be kept low. However, the reading potential α has a negative potential.

In negative sensing, the threshold distribution C does not shift easily and read-out errors do not occur easily even when being left for a long period of time because the absolute potential of the highest threshold distribution C can be reduced. Therefore, there is an advantage that the reliability is ensured easily even in the case where the downscaling of the memory cells progresses and multi-bit memory cells are used.

On the other hand, in negative sensing, it is necessary to provide a voltage step-up circuit of a negative potential inside the semiconductor memory device because the reading potential α has a negative potential. Also, it is necessary to modify the manufacturing processes to isolate the p-type well to which the negative potential is applied and the p-type well to which the ground potential is applied. Thus, negative sensing has the disadvantage that the configuration and the manufacturing processes of the semiconductor memory device become complex and the cost increases.

Therefore, in the embodiment, a positive CELSRC method in which a negative potential is not used is employed as negative sensing. The positive CELSRC method can be realized by providing the source potential adjustment circuit 22 and the sense amplifier control circuit 23. This operation will now be described.

In the semiconductor memory device 1 according to the embodiment as described above, the potential of the source line CELSRC is maintained at the positive reference potential VREF by the operation of the source potential adjustment circuit 22. The potential VBL of the bit lines BL is generated based on the potential of the source line CELSRC by the operation of the sense amplifier control circuit 23. Therefore, as shown in FIG. 4B, the threshold distributions A, B, and C are set by negative sensing; and the reference potential VREF is set to be the opposite of the reading potential α (−α), where the reading potential α is negative. In other words, VREF=−α (>0). Thereby, the potential of the source line CELSRC becomes −α (>0); and the potential VBL of the bit lines BL is set with the potential of the source line CELSRC as a reference. If the ground potential (0 V) is applied to the word line WL in this state, a relatively negative reading potential α can be realized because the potential of the word line WL can be relatively negative (α) with respect to the source line and the bit line.

Thus, according to the embodiment, negative sensing can be realized even in the case where the potential of the word line WL is 0 V by increasing the potential of the source line CELSRC which is used as the reference potential of the entire circuit system by −α (>0). Thereby, the absolute potential of the threshold distribution C can be reduced and the reliability can be ensured without forming a voltage step-up circuit of a negative potential, a p-type well isolation structure, etc.

Effects of the embodiment will now be described.

In the embodiment as described above, the magnitude of the cell current iCELL can be determined using the reference current iTARGET as a reference. Then, based on the determination result, the potential of the bit lines BL can be controlled and the cell current iCELL can be controlled by controlling the gate potential VBLC of the NMOS transistor MN0. Thereby, the current consumption can be reduced while maintaining the ON cell current at a constant distribution and suppressing the occurrence of the read-out errors. For example, the bit line potential can be reduced to prevent an excessive cell current from flowing in the stage in which the W/E number is small; and the bit line potential can be increased to ensure the ON cell current and guarantee the reliability of the reading in the state in which the W/E number increases. As a result, the current consumption for the entire period of use of the semiconductor memory device 1 can be reduced while guaranteeing the typical value of the W/E number necessary for the product.

Because the magnitude of the ON cell current is continuously constant according to the embodiment, the time parameters such as the charging time of the bit lines, etc., also can be determined uniquely. Thereby, the speed of operation of the semiconductor memory device 1 can be increased; and the current consumption can be reduced even further.

Also, in the embodiment, the reliability can be ensured while reducing the cost of the semiconductor memory device because the positive CELSRC method described above can be realized. The positive CELSRC method can be reliably realized because the potential of the source line CELSRC can be maintained at a constant potential (−α) regardless of the magnitude of the cell current iCELL by supplying the keeper current iSRCPRE to the source line CELSRC.

Although an example in which the reference current iTARGET is set to be the target value of the cell current iCELL is shown in the embodiment, this is not limited thereto. The reference current iTARGET and the NMOS transistor MN2 may be reduced from the cell current iCELL and the NMOS transistor MN1 by a constant proportion. Thereby, the magnitude of the cell current iCELL can be determined while reducing the current flowing in the cell current sensing unit 24. Because the cell current iCELL is a large current having a maximum of, for example, about 80 mA as described above, the current consumption can be reduced effectively by reducing the reference current iTARGET from the cell current iCELL by a constant proportion.

Although an example in which the controller 25 generates the signal VBL_DAC based on the output signal FLAG is shown in the embodiment, this is not limited thereto. For example, the user of the semiconductor memory device 1 may set the signal VBL_DAC manually based on the output signal FLAG. For example, the point where the value of the signal FLAG transitions may be found while continuously changing the value of the signal VBL_DAC.

A second embodiment will now be described.

Figure 5:
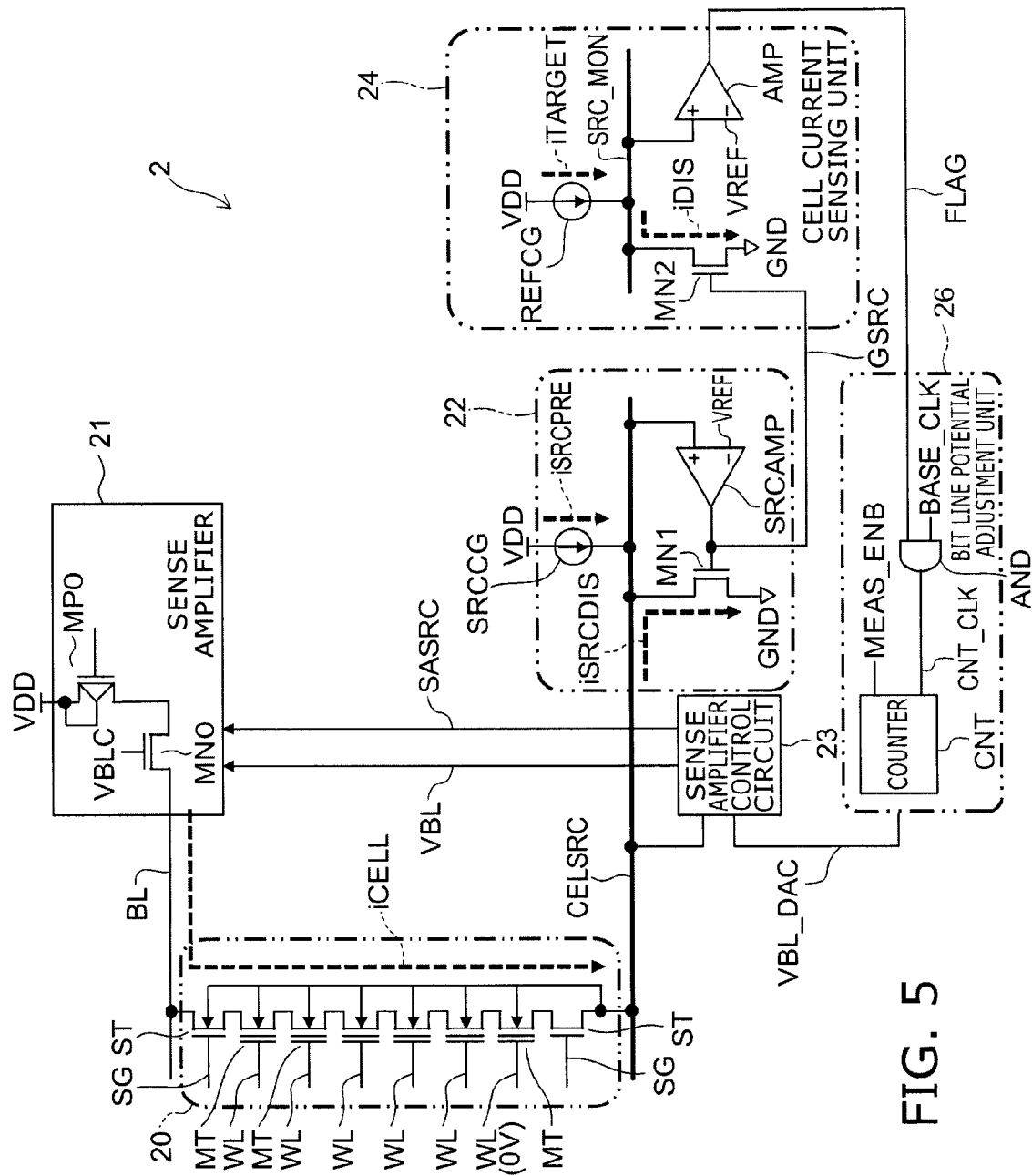
FIG. 5 is a circuit diagram showing a semiconductor memory device according to a second embodiment.

FIG. 5 is a circuit diagram showing a semiconductor memory device according to the embodiment.

As shown in FIG. 5, the semiconductor memory device 2 according to the embodiment differs from the semiconductor memory device 1 (referring to FIG. 1) according to the first embodiment described above in that a bit line potential adjustment unit 26 is provided instead of the controller 25 (referring to FIG. 1). In the embodiment, the output signal FLAG is input not to the controller 25 (referring to FIG. 1) but to the bit line potential adjustment unit 26; and the signal VBL_DAC is generated not by the controller 25 but by the bit line potential adjustment unit 26.

7. Bit Line Potential Adjustment Unit 26

The bit line potential adjustment unit 26 includes an AND-gate circuit AND and a counter CNT. A base clock BASE_CLK of the semiconductor memory device 2 and the output signal FLAG of the op-amp AMP are input to the AND-gate circuit AND. The AND-gate circuit AND outputs a count clock CNT_CLK which is the AND operation of the base clock BASE_CLK and the output signal FLAG. Other than the count clock CNT_CLK, a signal MEAS_ENB that is asserted in the interval in which the bit line potential is adjusted is input to the counter CNT. During the interval in which the value of the signal MEAS_ENB is "H," the counter CNT increments (counts up) the value of the signal VBL_DAC synchronously with the count clock CNT_CLK and outputs the signal VBL_DAC to the sense amplifier control circuit 23. The signal VBL_DAC is, for example, a digital signal of four bits. As the value of the signal VBL_DAC increases, the sense amplifier control circuit 23 sets the potential VBL such that the current flowing through the NMOS transistor MN0 increases; and the sense amplifier 21 sets the gate potential VBLC according to the potential VBL.

Otherwise, the configuration of the embodiment is similar to that of the first embodiment described above.

Operations of the semiconductor memory device according to the embodiment will now be described.

The operations of <1> to <4> described in the first embodiment described above also are executed in the embodiment. The independent operations of the embodiment will now be described.

<5> Control of the Magnitude of the Cell Current

First, the method in which the bit line potential adjustment unit 26, the sense amplifier control circuit 23, and the sense amplifier 21 control the magnitude of the cell current based on the output signal FLAG that represents the determination result of the magnitude of the cell current will be described.

Figure 6:
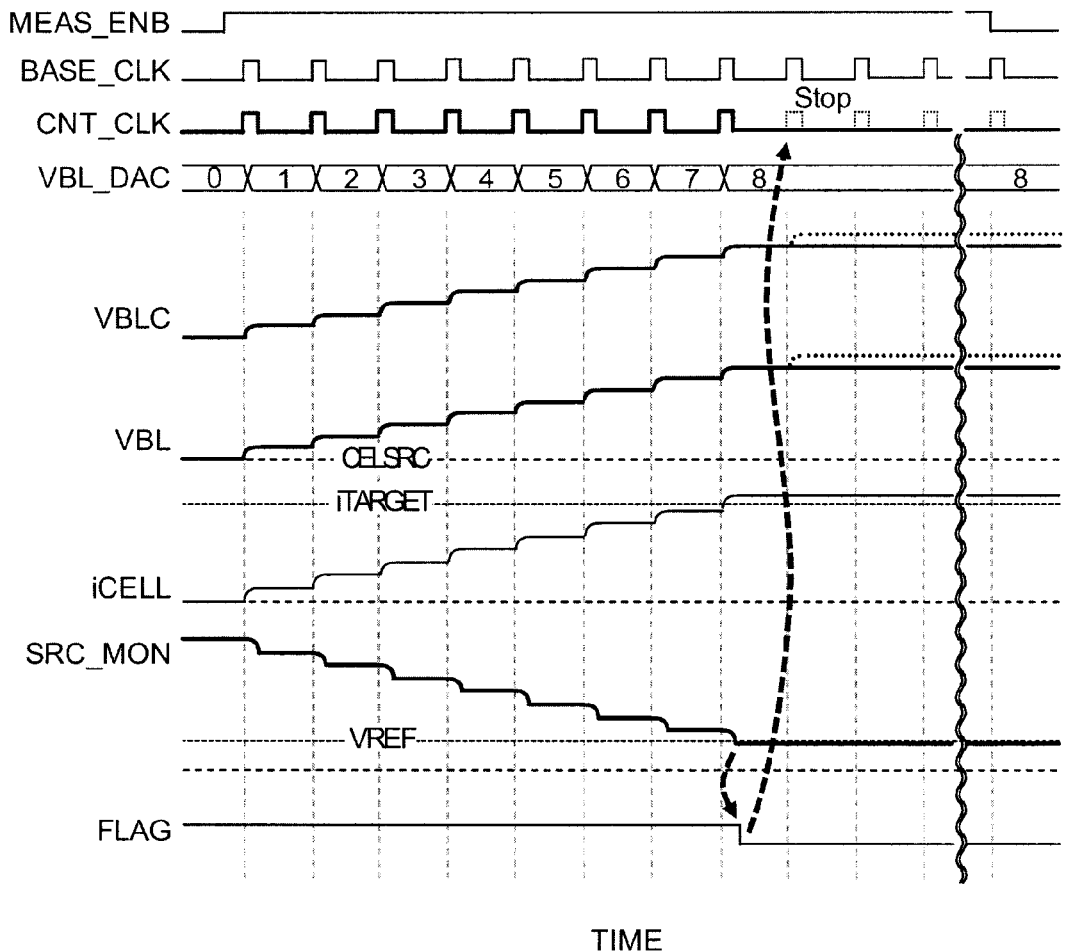
FIG. 6 is a timing chart showing the operations of the semiconductor memory device according to the second embodiment.

FIG. 6 is a timing chart showing the operations of the semiconductor memory device according to the embodiment, where the horizontal axis is the time, and the vertical axis is the signals, the potentials, and the currents.

As shown in FIG. 5 and FIG. 6, the base clock BASE_CLK is constantly input to the AND-gate circuit AND as a precondition. In the initial state, the value of the signal MEAS_ENB is "L;" and the value of the signal VBL_DAC is "0." The potential VBL of the bit lines BL is equal to the potential of the source line CELSRC; and accordingly, the cell current iCELL does not flow.

As described above, the value of the output signal FLAG of the op-amp AMP becomes "H" when the cell current iCELL is smaller than the reference current iTARGET. When the value of the output signal FLAG is "H," the AND-gate circuit AND outputs the count clock CNT_CLK that has the same period as the base clock BASE_CLK. However, at this stage, the value of the signal VBL_DAC remains as "0" because the value of the signal MEAS_ENB is "L."

The adjusting of the bit line potential is started in this state. At this time, the value of the signal MEAS_ENB switches from "L" to "H." Thereby, the counter CNT starts the increment of the signal VBL_DAC synchronously with the count clock CNT_CLK to increase the value of the signal VBL_DAC one at a time.

When the value of the signal VBL_DAC increases, the sense amplifier control circuit 23 increases the potential VBL to be applied to the bit lines to correspond to the increase of the value of the signal VBL_DAC and outputs the potential VBL to the sense amplifier 21. The sense amplifier 21 increases the degree of the conduction of the NMOS transistor MN0 in stages by increasing the gate potential VBLC in stages to correspond to the increase of the potential VBL. Thereby, the potential of the bit lines BL increases in stages. In other words, a potential that is the same as the potential VBL generated by the sense amplifier control circuit 23 is actually applied to the bit lines BL. As a result, the cell current iCELL begins to flow and increases in stages.

Then, when the cell current iCELL becomes larger than the reference current iTARGET, the value of the output signal FLAG of the op-amp AMP switches from "H" to "L." Thereby, the AND-gate circuit AND stops the output of the count clock CNT_CLK; and the counter CNT stops the increment of the signal VBL_DAC. As a result, the value of the signal VBL_DAC is fixed and is retained by the counter CNT. In the example shown in FIG. 6, the value of the signal VBL_DAC is fixed at "8."Accordingly, the potential VBL also is fixed; the gate potential VBLC also is fixed; and the actual bit line potential also is fixed. As a result, the magnitude of the ON cell current also is fixed. Thus, the bit line potential is automatically adjusted based on the output signal FLAG; and the magnitude of the ON cell current is controlled.

<6> Timing of the Determination and Control of the Cell Current

The timing of the determination and control of the magnitude of the cell current described above in the programming operation and read-out operation of the NAND flash memory will now be described.

FIG. 7A shows the sequence of the programming operation of the embodiment; and FIG. 7B shows the sequence of the read-out operation.

In the programming operation of the data in the NAND flash memory, the programming (the program) of the data to the memory cell transistors and the verification (the verify) of whether or not the data is programmed to the memory cell transistors are performed alternately. The verify operation is performed at the same conditions as the read-out operation of the data. Therefore, a shift in the read-out result undesirably occurs in the case where the bit line potential is adjusted individually in the verify operation and the read-out operation. Accordingly, it is favorable for the bit line potential that is adjusted in one of the operations to be used commonly. When determining the magnitude of the cell current in the state in which actual data is programmed to the memory cell transistors, an error occurs in the bit line potential that is adjusted because the magnitude of the cell current is undesirably different between data patterns programmed to the pages to be read. Therefore, it is favorable for the bit line potential to be adjusted by constantly using the same data pattern.

Considering these conditions, it is favorable for the determination and control of the magnitude of the cell current to be performed in an initial step W0 of the sequence of the programming operation, that is, directly prior to the initial program process shown in step W1 as shown in FIG. 7A. This is because all of the memory cell transistors included in the page to be read are guaranteed to be in the erase state in step W0. Therefore, the determination and control of the magnitude of the cell current can be performed by constantly using the same data pattern. As shown in FIGS. 4A and 4B, the thresholds of the memory cell transistors have the threshold distribution E in the erase state. Therefore, the state shown in step W0 is the state in which the cell current is the largest.

Then, after performing the determination and control of the magnitude of the cell current in step W0, the programming (the program) and the verification (the verify) of the data to the memory cell transistors are performed alternately. At this time, in the initial program process shown in step W1, the value of the signal VBL_DAC (e.g., "8") that represents the bit line potential determined in step W0 is programmed to a memory cell transistor belonging to the same page. On the other hand, in the verify operations shown in steps W2, W4, W6, . . . , the bit line potential is adjusted using the value of the signal VBL_DAC retained by the counter CNT.

On the other hand, the value of the signal VBL_DAC retained by the counter CNT cannot be used in the read-out operation of the data. This is because there is a possibility that the power supply may be interrupted between the programming operation and the read-out operation and the counter CNT cannot retain the count value because the NAND flash memory is a nonvolatile memory.

Therefore, in the embodiment as shown in FIG. 7B, the read-out operation is executed by being divided into two steps. First, as shown in step R1, the value of the signal VBL_DAC is read from the page to be read. This value was programmed in step W1 described above. In such a case, the bit line potential is a fixed potential that is not adjusted. Then, as shown in step R2, the actual data is read from the memory cell transistors belonging to the page after adjusting the bit line potential using the value of the signal VBL_DAC read in step R1.

When programming the value of the signal VBL_DAC in step W1, the value of the signal VBL_DAC may be programmed using only the threshold distributions E and C without using the threshold distributions A and B. Thereby, although the bit density of the data decreases, the read-out operation is easier. As a result, when reading the value of the signal VBL_DAC in step R1, the value of the signal VBL_DAC can be read prior to the bit lines being completely charged; the time necessary for the read-out operation can be shortened; and the current consumption can be reduced. Otherwise, the operation of the embodiment is similar to that of the first embodiment described above.

Effects of the embodiment will now be described.

By providing the bit line potential adjustment unit 26 in the embodiment as described above, the appropriate bit line potential can be automatically adjusted without operating the bit line potential from the outside. Thereby, the cell current can be controlled often with high precision; and the current consumption can be reduced more effectively. Because the determination and control of the magnitude of the cell current can be performed at the start of the sequence of the programming operation, the magnitude of the cell current can be determined by constantly using the same data pattern; and the bit line potential can be adjusted with high precision. Because the adjustment result of the bit line potential for one of the pages is programmed to the same page, the adjustment result can be used in the read-out operation of the data as well. As a result, a common bit line potential can be used between the verify operation and the read-out operation; and the precision of the read-out operation increases. Otherwise, effects of the embodiment are similar to those of the first embodiment described above.

A third embodiment will now be described.

Figure 8:
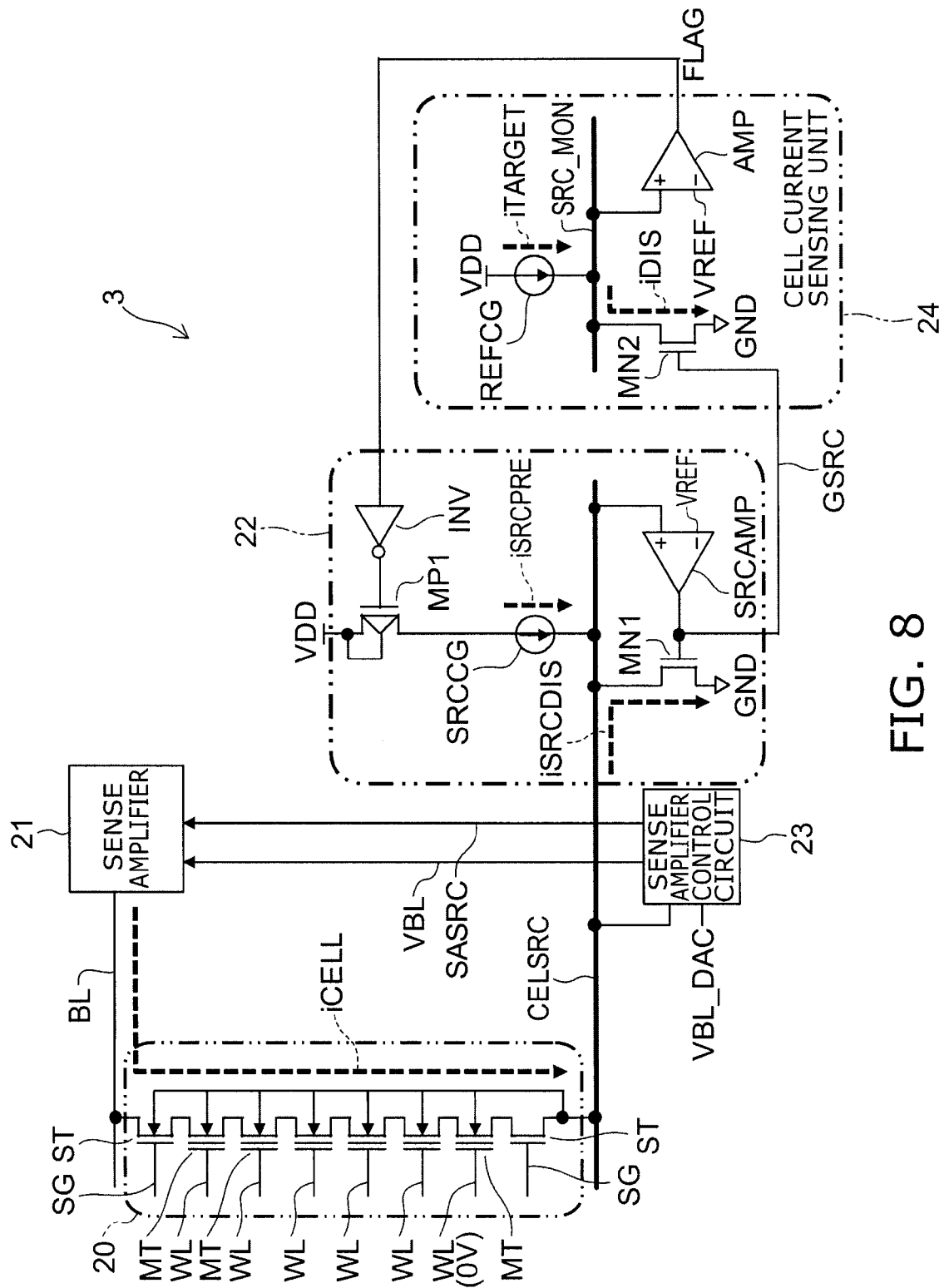
FIG. 8 is a circuit diagram showing a semiconductor memory device according to a third embodiment.

FIG. 8 is a circuit diagram showing a semiconductor memory device according to the embodiment.

As shown in FIG. 8, the semiconductor memory device 3 according to the embodiment differs from the semiconductor memory device 1 (referring to FIG. 1) according to the first embodiment described above in that the source potential adjustment circuit 22 includes a PMOS transistor MP1 and an inverter INV. The PMOS transistor MP1 is connected between the power supply potential VDD and the constant current source SRCCG and is a switching element that controls the ON/OFF of the keeper current iSRCPRE. The output of the inverter INV is input to the gate electrode of the PMOS transistor MP1. The output signal FLAG of the op-amp AMP is input to the input terminal of the inverter INV.

Operations of the semiconductor memory device according to the embodiment will now be described.

The programming operation and the read-out operation of <1> and the positive CELSRC method of <4> described in the first embodiment described above also are executed in the embodiment. The independent operations of the embodiment will now be described.

<7> ON/OFF Control of the Keeper Current

As described above, the keeper current iSRCPRE is a minimum guaranteed current to maintain the potential of the source line CELSRC in the case where the cell current iCELL is extremely small. Therefore, the keeper current iSRCPRE is unnecessary in the case where the cell current iCELL is somewhat large. Although the keeper current iSRCPRE is small compared to the cell current iCELL, the amount of the keeper current iSRCPRE cannot be ignored as an entirety because the keeper current iSRCPRE flows constantly in the first and second embodiments described above. Therefore, in the embodiment, the keeper current iSRCPRE is stopped when the cell current iCELL is large.

Specifically, in the cell current sensing unit 24, the magnitude of the reference current iTARGET is set to be a magnitude corresponding to the boundary value of the cell current iCELL where the keeper current iSRCPRE is necessary or unnecessary, that is, the lower limit of the range of the cell current iCELL in which the keeper current iSRCPRE is unnecessary.

Thus, in the case where the cell current iCELL is larger than the magnitude corresponding to the reference current iTARGET, the discharge current iSRCDIS also is large; and the discharge current iDIS is larger than the reference current iTARGET in conjunction with the discharge current iSRC-DIS. Therefore, the potential of the pseudo-source line SRC_MON decreases; and the value of the signal FLAG becomes "L." Thereby, the value of the output signal of the inverter INV becomes "H;" the PMOS transistor MP1 is switched to the OFF state; and the supply of the keeper current iSRCPRE to the source line CELSRC stops. On the other hand, in the case where the cell current iCELL is smaller than the amount corresponding to the reference current iTARGET, the value of the signal FLAG becomes "H;" the PMOS transistor MP1 is switched to the ON state; and the keeper current iSRCPRE is supplied to the source line CELSRC. Thus, the ON/OFF of the keeper current iSRCPRE can be controlled.

Effects of the embodiment will now be described.

In the embodiment, the keeper current can be stopped when the cell current is large. Thereby, the current consumption can be reduced.

In the embodiment, the connections on the input side of the op-amp AMP may be reversed. In other words, the reference potential VREF may be input to the positive-side input terminal of the op-amp AMP; and the negative-side input terminal may be connected to the pseudo-source line SRC_MON. Thereby, the inverter INV can be omitted.

The embodiment can be combined with the first or second embodiment described above. However, the embodiment is different from the first and second embodiments in that the magnitude of the reference current iTARGET that is set in the first and second embodiments corresponds to the target value of the cell current iCELL; and in the embodiment, the magnitude of the reference current iTARGET that is set corresponds to the cell current iCELL of the boundary of the keeper current iSRCPRE being necessary/unnecessary. Therefore, in the case where the embodiment is combined with the first or second embodiment, two cell current sensing units 24 are provided; in one of the cell current sensing units 24, the magnitude of the reference current iTARGET is an amount corresponding to the target value of the cell current iCELL, and the output signal FLAG is output to the controller 25 or the bit line potential adjustment unit 26; and in the other cell current sensing unit 24, the magnitude of the reference current iTARGET is an amount corresponding to the boundary value of the keeper current iSRCPRE being necessary/unnecessary, and the output signal FLAG is output to the inverter INV.

In the case where the embodiment is combined with the first embodiment described above, the operations of <1> to <4> and <7> described above are executed. In the case where the embodiment is combined with the second embodiment described above, all of the operations of <1> to <7> described above are executed. Thus, by combining the embodiment with the first or second embodiment described above, the effects of the first or second embodiment can be obtained in addition to the effects of the embodiment.

According to the embodiments described above, a semiconductor memory device having low current consumption can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first transistor, a first end of the first transistor being electrically connected to a first power supply;
   a plurality of memory cells being electrically connected between a second end of the first transistor and a second power supply; and
   a controller configured to perform a read sequence, the read sequence including a first operation and a read operation, the first operation being performed before he read operation, the controller being configured to progressively increase a voltage of a gate of the first transistor to a first voltage in a first period of the first operation, the controller being configured to progressively increase a voltage of a gate of the first transistor from the first voltage to a second voltage in a second period of the first operation, the second voltage being higher than the first voltage, the controller being configured to perform the read operation on a condition that either of the first voltage or the second voltage is applied to the gate of the first transistor.

2. The device according to claim 1, further comprising a sensing unit configured to compare a cell current flowing in the memory cells to a reference current.

3. The device according to claim 2, further comprising:
   a source line electrically connected to the memory cells;
   a second transistor, one end of the second transistor being electrically connected to the source line, other end of the second transistor being electrically connected to the second power supply; and
   a first op-amp, an output of the first op-amp being electrically connected to a gate of the second transistor, one input of the first op-amp being electrically connected to the source line, and another input of the first op-amp being electrically connected to a reference potential,
   the sensing unit including:
      a pseudo-source line;
      a reference current source configured to supply the reference current to the pseudo-source line;
      a third transistor, one end of the third transistor being electrically connected to the pseudo-source line, other end of the third transistor being electrically connected to the second power supply, a potential applied to a gate of the third transistor being the same as the potential applied to the gate of the second transistor; and
      a second op-amp, an output of the second op-amp being electrically connected to the controller, one input of the second op-amp being electrically connected to the pseudo-source line, and the second op-amp being connected to the reference potential.

4. The device according to claim 2, further comprising a cell current control unit configured to set a voltage applied to the gate of the first transistor based on a comparison result of the sensing unit to cause the cell current o approach the reference current.

5. The device according to claim 4, wherein the cell current control unit includes:
   a bit line potential adjustment unit configured to cause a counter value to sequentially change based on a clock signal and stop an operation of a counter when an output of the sensing unit transitions; and
   a circuit configured to set the voltage applied to the gate of the first transistor according to the counter value.

6. The device according to claim 1. further comprising:
a source line electrically connected to the memory cells;
a constant current source configured to supply a constant current to the source line;
a sensing unit configured to compare a cell current flowing in the memory cells to a reference current; and
a switching element configured to stop the constant current when the sensing unit determines the cell current to be larger than the reference current.

7. A semiconductor memory device, comprising:
a first transistor, one end of the first transistor being electrically connected to a first power supply;
a plurality of word lines,
a plurality of memory cells, and
a controller configured to perform a read sequence, the read sequence including a first operation and a read operation, the first operation being performed before the read operation,
the controller being configured to progressively increase a voltage of a gate of the first transistor to a first voltage in a first period of the first operation, the controller being configured to progressively increase a voltage of a gate of the first transistor from the first voltage to a second voltage in a second period of the first operation, the second voltage being higher than the first voltage,
the controller being configured to perform the read operation on a condition that either of the first voltage or the second voltage. is applied to the gate of the first transistor.

8. The device according to claim 7. further comprising a sensing unit configured to compare a cell current flowing in the memory cells to a reference current.

9. The device according to claim 8, further comprising:
a source line electrically connected to the memory cells;
a second transistor, one end of the second transistor being electrically connected to the source line, other end of the second transistor being electrically connected to a second power supply; and
a first op-amp, an output of the first op-amp being electrically connected to a gate of the second transistor, one input of the first op-amp being electrically connected to the source line, and another input of the first op-amp being electrically connected to a reference potential,
the sensing unit including:
a pseudo-source line;
a reference current source configured to supply the reference current to the pseudo-source fine;
a third transistor, one end of the third transistor being electrically connected to the pseudo-source line, other end of the third transistor being electrically connected to the second power supply, a potential applied to a gate of the third transistor being the same as the potential applied to the gate of the second transistor; and
a second op-amp, an output of the second op-amp being connected to the controller, one input of the second op-amp being electrically connected to the pseudo-source line, and another input of the second op-amp being electrically connected to the reference potential.

10. The device according to claim 8, further comprising a cell current control unit configured to set a voltage applied to the gate of the first transistor based on a comparison result of the sensing unit to cause the cell current to approach the reference current.

11. The device according to claim 10, wherein the cell current control unit includes:

a bit line potential adjustment unit configured to cause a counter value to sequentially change based on a clock signal and stop an operation of a counter when an output of the sensing unit transitions; and
a circuit configured to set the voltage applied to the gate of the first transistor according to the counter value.

12. The device according to claim 7, further comprising:
a source line electrically connected to the memory cells;
a constant current source configured to supply a constant current to the source line;
a sensing unit configured to compare a cell current flowing in the memory cells to a reference current; and
a switching element configured to stop the constant current when the sensing unit determines the cell current to be larger than the reference current.

13. The device according to claim 1, further comprising:
a bit line electrically connected between one other end of the first transistor and the memory cells;
a source line electrically connected between the memory cells and the second power supply; and
a plurality of word lines,
a voltage applied to the gate of the first transistor being changed in an interval directly prior to programming data into memory cells connected between the bit line and the source line, the word lines being used as gates of the memory cell transistors,
the last voltage applied to the gate in the interval being applied to the gate when reading the data from the memory cell transistors.

14. An operation method of a semiconductor memory device, comprising:
reading data from a memory cell by a first operation and a read operation, the first operation being performed before the read operation,
a gate potential of a first transistor being progressively-increasing to a first voltage in a first period of the first operation, the gate potential of a first transistor being progressively-increasing from the first voltage to a second voltage in a second period of the first operation, the second voltage being higher than the first voltage, the first transistor being electrically connected between a first power supply and the memory cell,
either the first voltage or the second voltage being applied to the gate of the first transistor in the read operation.

15. The method according to claim 14, wherein a cell current flowing in the memory cell is compared with a reference current.

16. The method according to claim 15, wherein the reference current is supplied to a pseudo-source line, a potential of the pseudo-source line is compared with a reference potential, a first potential is applied to a gate of a second transistor electrically connected between a source line and a second power supply, the source line is electrically connected to the memory cell, the first potential is same as a gate potential of a third transistor electrically connected between the pseudo-source line and the second power supply.

17. The method according to claim 15, wherein the gate potential of the first transistor is set to cause the cell current to approach the reference current based on a comparison result of the cell current and the reference current.

18. The method according to claim 17, wherein a counter value changes sequentially based on a clock signal and stops when a comparison result of the cell current and the reference current changes, and the gate potential of the first transistor is set based on the counter value.

19. The method according to claim 14, wherein a constant current supplied to a source line stops when a cell current flowing in the memory cell is larger than the reference current, the source line is electrically connected the memory cell.

* * * * *